US011527970B2

(12) United States Patent
Murakami

(10) Patent No.: US 11,527,970 B2
(45) Date of Patent: Dec. 13, 2022

(54) CONTROL METHOD OF PIEZOELECTRIC DRIVING DEVICE AND PIEZOELECTRIC DRIVING DEVICE

(71) Applicant: Seiko Epson Corporation, Tokyo (JP)

(72) Inventor: Makoto Murakami, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 379 days.

(21) Appl. No.: 16/827,870

(22) Filed: Mar. 24, 2020

(65) Prior Publication Data

US 2020/0313574 A1 Oct. 1, 2020

(30) Foreign Application Priority Data

Mar. 25, 2019 (JP) .............................. JP2019-057417

(51) Int. Cl.
*H02N 2/14* (2006.01)
*H01L 41/04* (2006.01)
*H01L 41/09* (2006.01)
*H02N 2/00* (2006.01)

(52) U.S. Cl.
CPC ........... *H02N 2/142* (2013.01); *H01L 41/042* (2013.01); *H01L 41/0913* (2013.01); *H02N 2/004* (2013.01)

(58) Field of Classification Search
CPC ...... H02N 2/142; H02N 2/004; H02N 2/0075; H02N 2/103; H02N 2/028; H02N 2/062; H01L 41/042; H01L 41/0913
See application file for complete search history.

(56) References Cited

U.S. PATENT DOCUMENTS

| 6,031,316 | A | * | 2/2000 | Kataoka | H02N 2/103 318/116 |
| 7,003,222 | B1 | * | 2/2006 | Murakami | H04N 5/232122 348/E5.04 |
| 2005/0067921 | A1 | * | 3/2005 | Yamamoto | H02N 2/142 310/317 |
| 2009/0180202 | A1 | * | 7/2009 | Knoedgen | G02B 7/023 359/823 |
| 2014/0009846 | A1 | * | 1/2014 | Murakami | H02N 2/008 318/116 |

FOREIGN PATENT DOCUMENTS

| JP | 2003-288122 A | 10/2003 |
| JP | 2008-079396 A | 4/2008 |
| JP | 2010-183816 A | 8/2010 |

* cited by examiner

*Primary Examiner* — Emily P Pham
(74) *Attorney, Agent, or Firm* — Yu Gang

(57) ABSTRACT

A control method of a piezoelectric driving device which includes a vibrator including a piezoelectric element and vibrating by application of a drive signal to the piezoelectric element, a driven unit moving by the vibration of the vibrator, a drive signal generation unit generating the drive signal based on a pulse signal, the control method including: stopping the application of the drive signal to the piezoelectric element at the time when a driving speed of the driven unit is a reference speed, in a case of stopping driving of the driven unit.

12 Claims, 7 Drawing Sheets

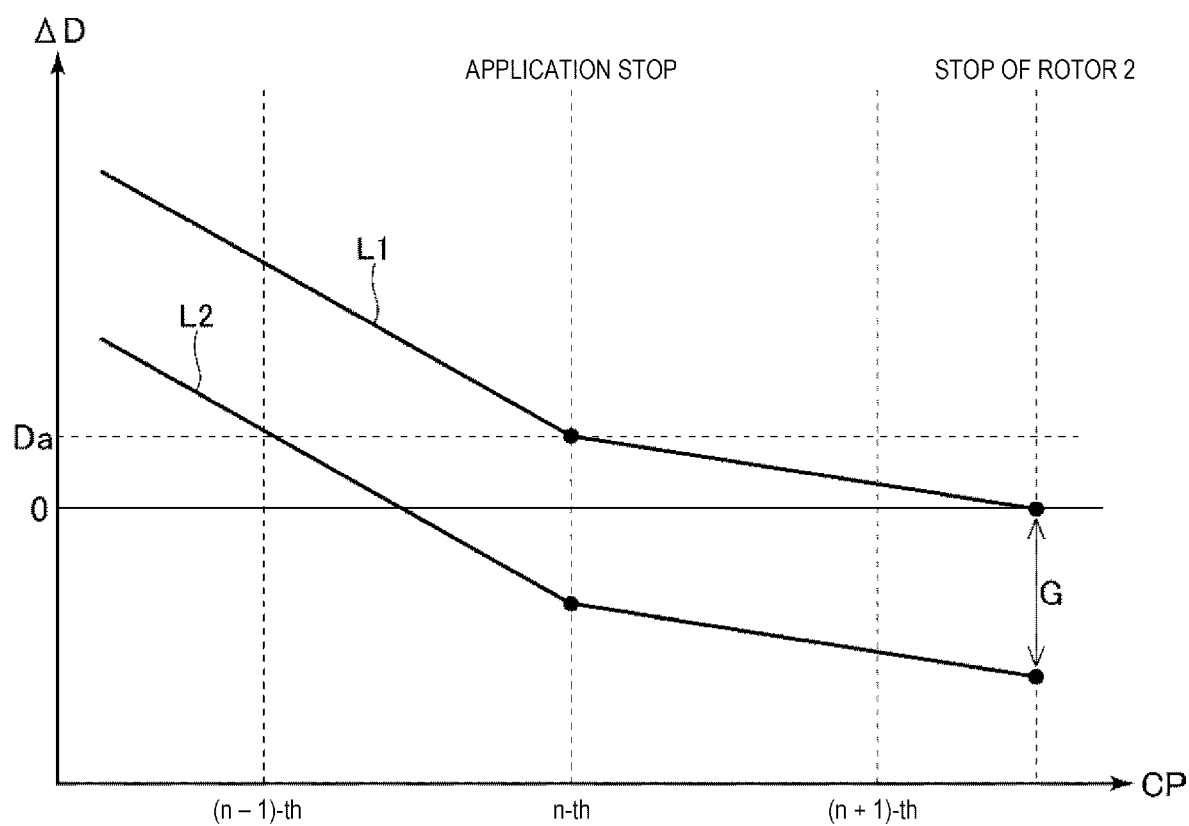

CONTROL METHOD OF PIEZOELECTRIC DRIVING DEVICE AND PIEZOELECTRIC DRIVING DEVICE

The present application is based on, and claims priority from JP Application Serial Number 2019-057417, filed Mar. 25, 2019, the disclosure of which is hereby incorporated by reference herein in its entirety.

BACKGROUND

1. Technical Field

The present disclosure relates to a control method of a piezoelectric driving device and a piezoelectric driving device.

2. Related Art

For example, JP-A-2010-183816 discloses a control method at the time of stopping an ultrasonic motor in which when the ultrasonic motor approaches a stop position, a driving speed of the ultrasonic motor is reduced and the ultrasonic motor is stopped at the stop position. In addition, the driving speed is controlled by changing a duty of a drive pulse signal, and the driving speed is reduced as the duty approaches 50% to 0%.

As described above, in the control method of an ultrasonic motor of JP-A-2010-183816, although the driving speed is controlled by changing the duty of the drive pulse signal, a waveform of the drive signal is deformed when the duty of the drive pulse signal approaches 0%. Therefore, it is difficult to highly accurately control the ultrasonic motor. Thus, it is difficult to exhibit high accuracy of the stop position.

SUMMARY

A control method of a piezoelectric driving device according to the present disclosure is a control method of a piezoelectric driving device which includes a vibrator including a piezoelectric element and vibrating by application of a drive signal to the piezoelectric element, a driven unit moving by the vibration of the vibrator, a drive signal generation unit generating the drive signal based on a pulse signal, the control method including: stopping the application of the drive signal to the piezoelectric element at the time when a driving speed of the driven unit is a reference speed, in a case of stopping driving of the driven unit.

BRIEF DESCRIPTION OF THE DRAWINGS

FIG. 7 is a graph for explaining a control method of the control device.

DESCRIPTION OF EXEMPLARY EMBODIMENTS

Hereinafter, a control method of a piezoelectric driving device and a piezoelectric driving device according to the present disclosure will be described in detail, based on a preferred embodiment illustrated in the accompanying drawings.

Figure 1:
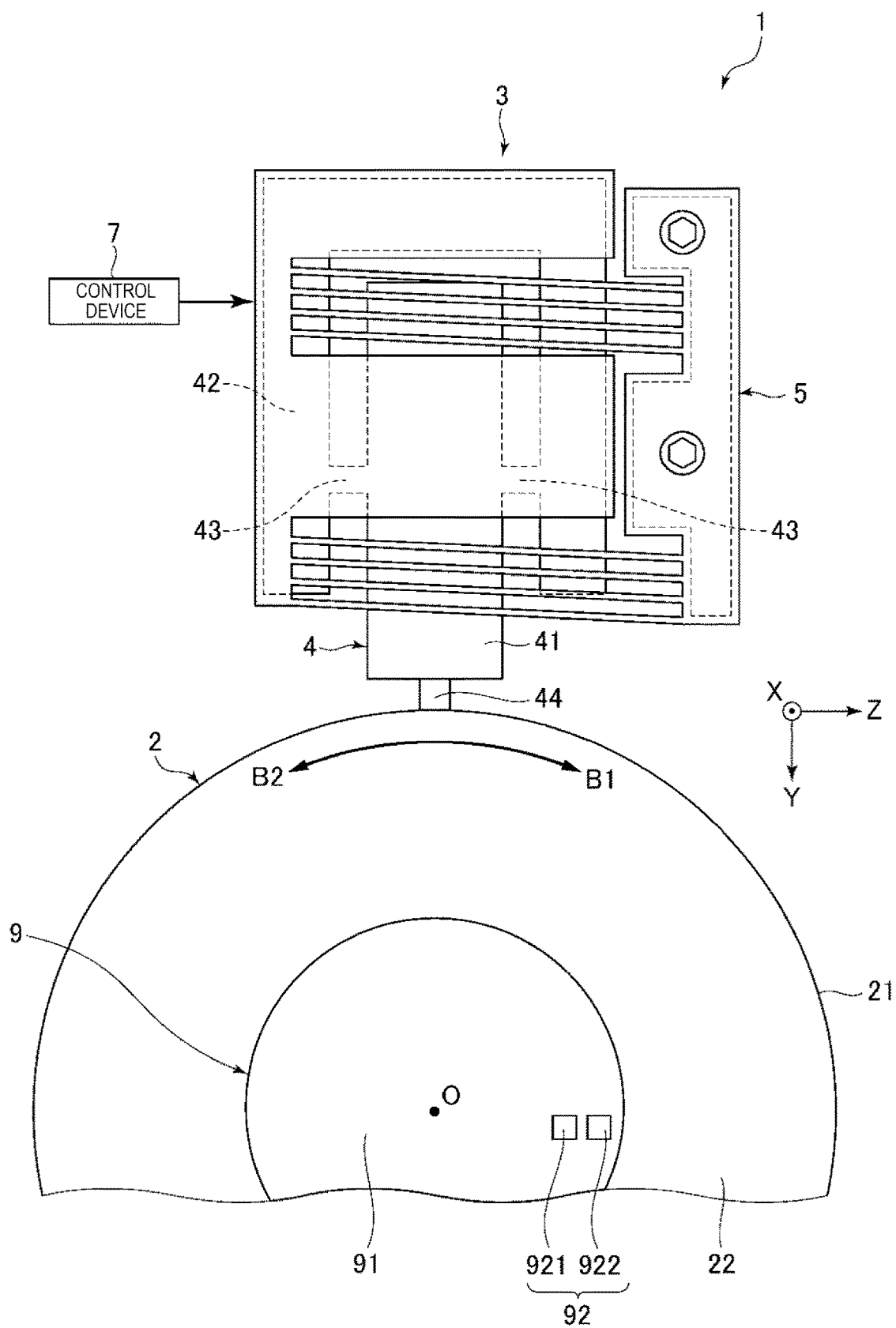
FIG. 1 is a plan view illustrating a piezoelectric driving device according to a preferred embodiment of the present disclosure.
Figure 2:
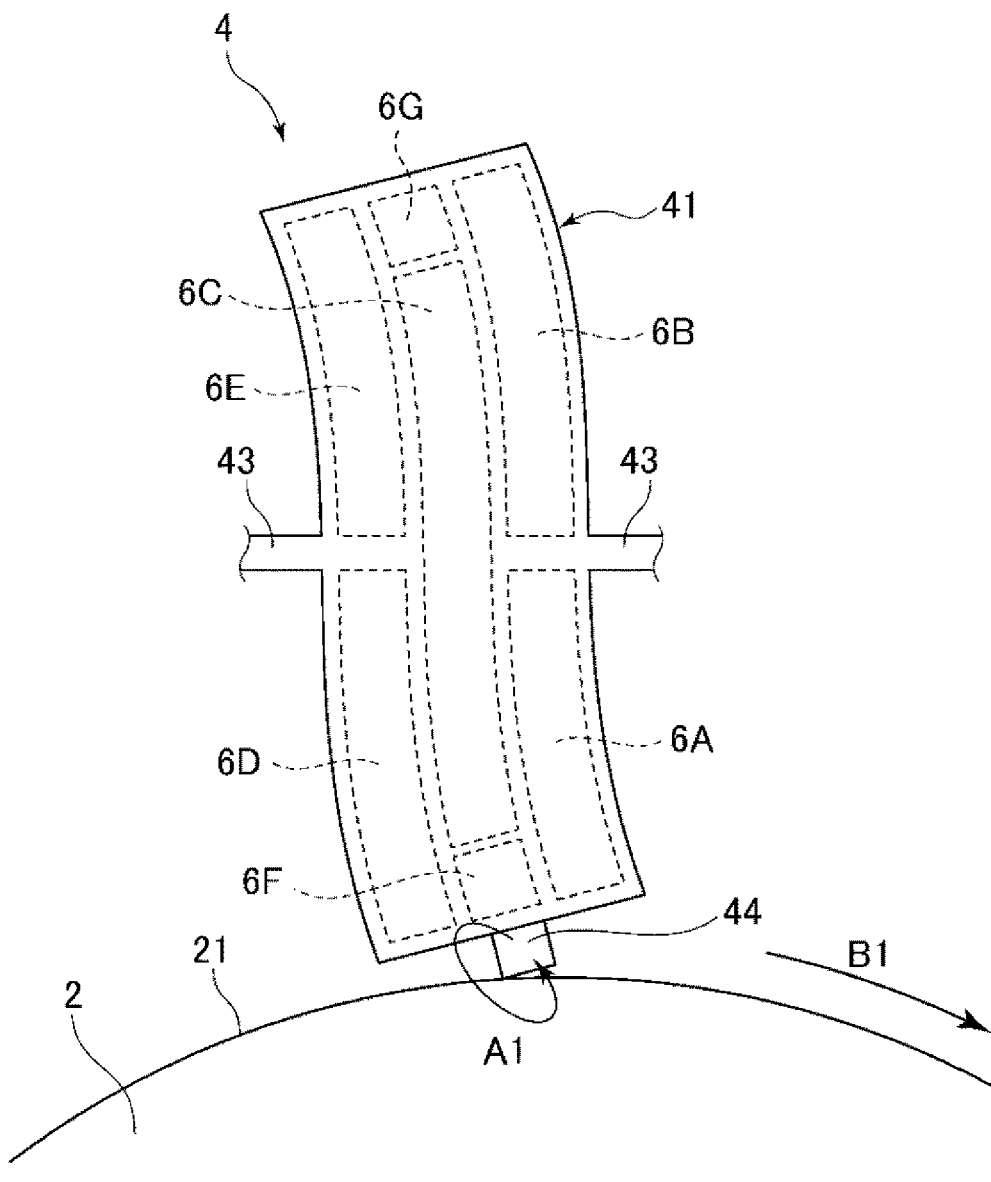
FIG. 2 is a plan view for explaining driving of a piezoelectric actuator.
Figure 3:
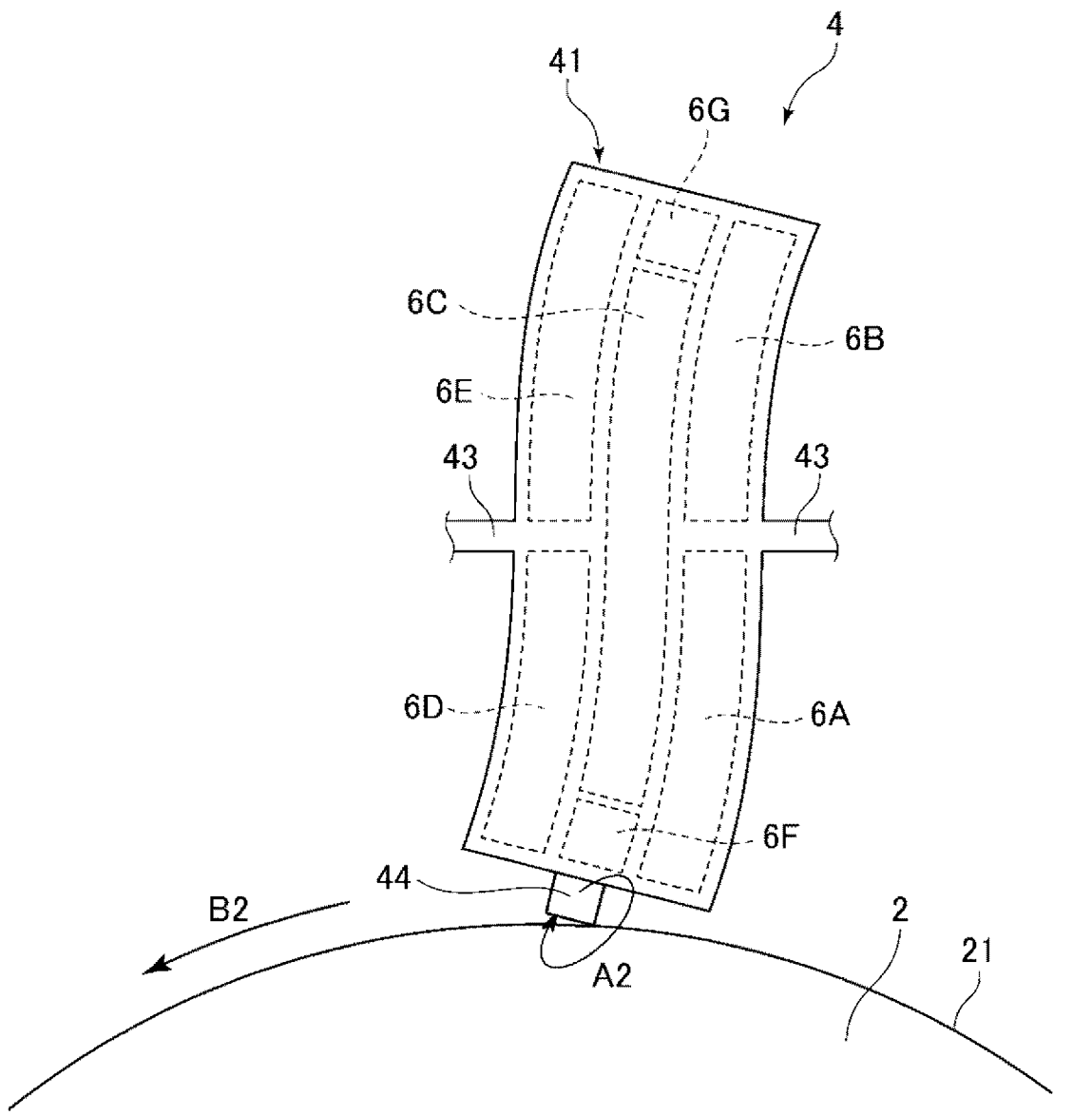
FIG. 3 is a plan view for explaining driving of the piezoelectric actuator.
Figure 3:
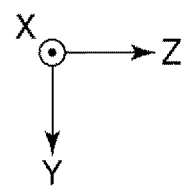
Figure 4:
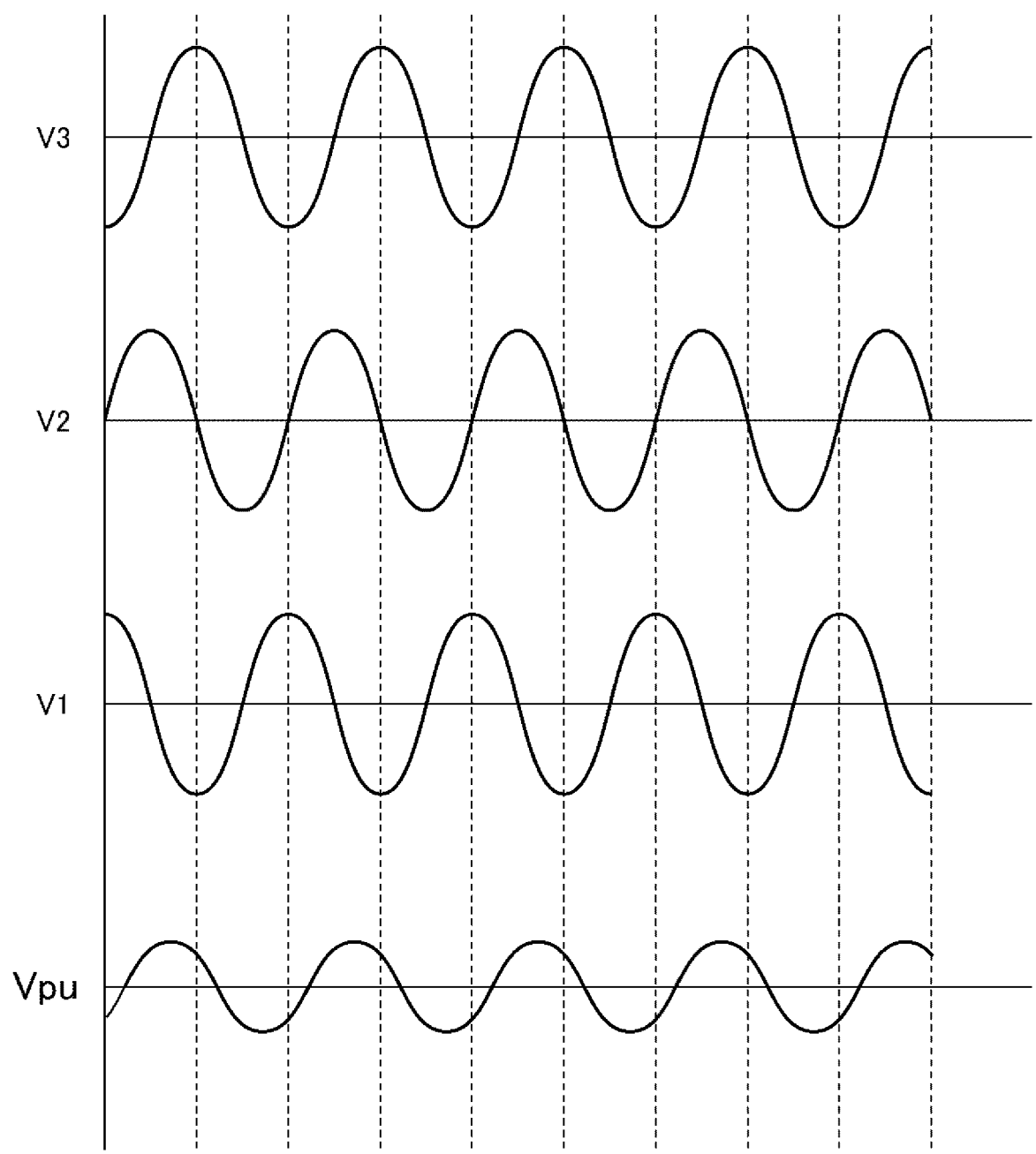
FIG. 4 is a view illustrating a drive signal applied to the piezoelectric actuator.
Figure 5:
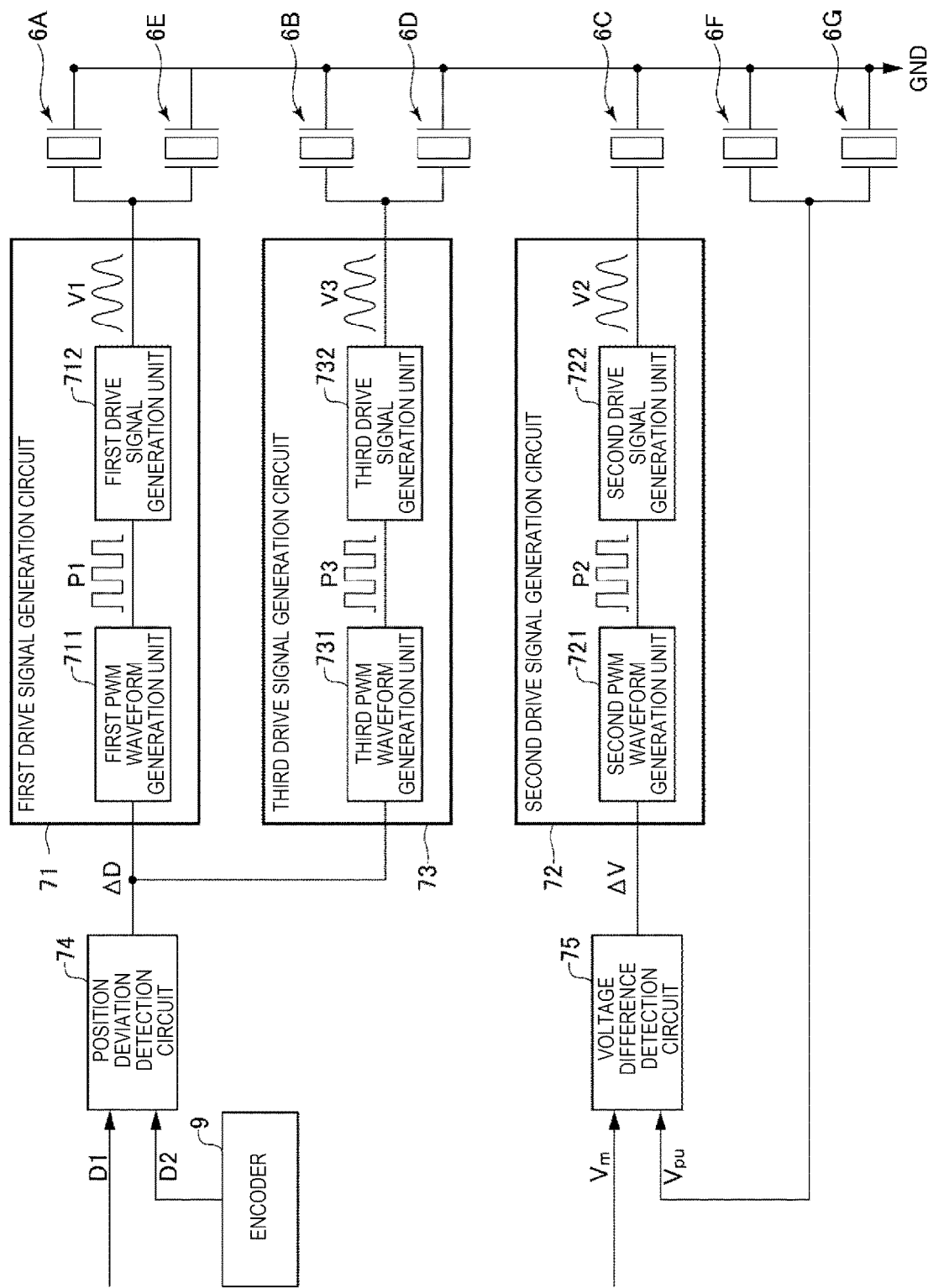
FIG. 5 is a block diagram illustrating a circuit configuration of a control device.
Figure 6:
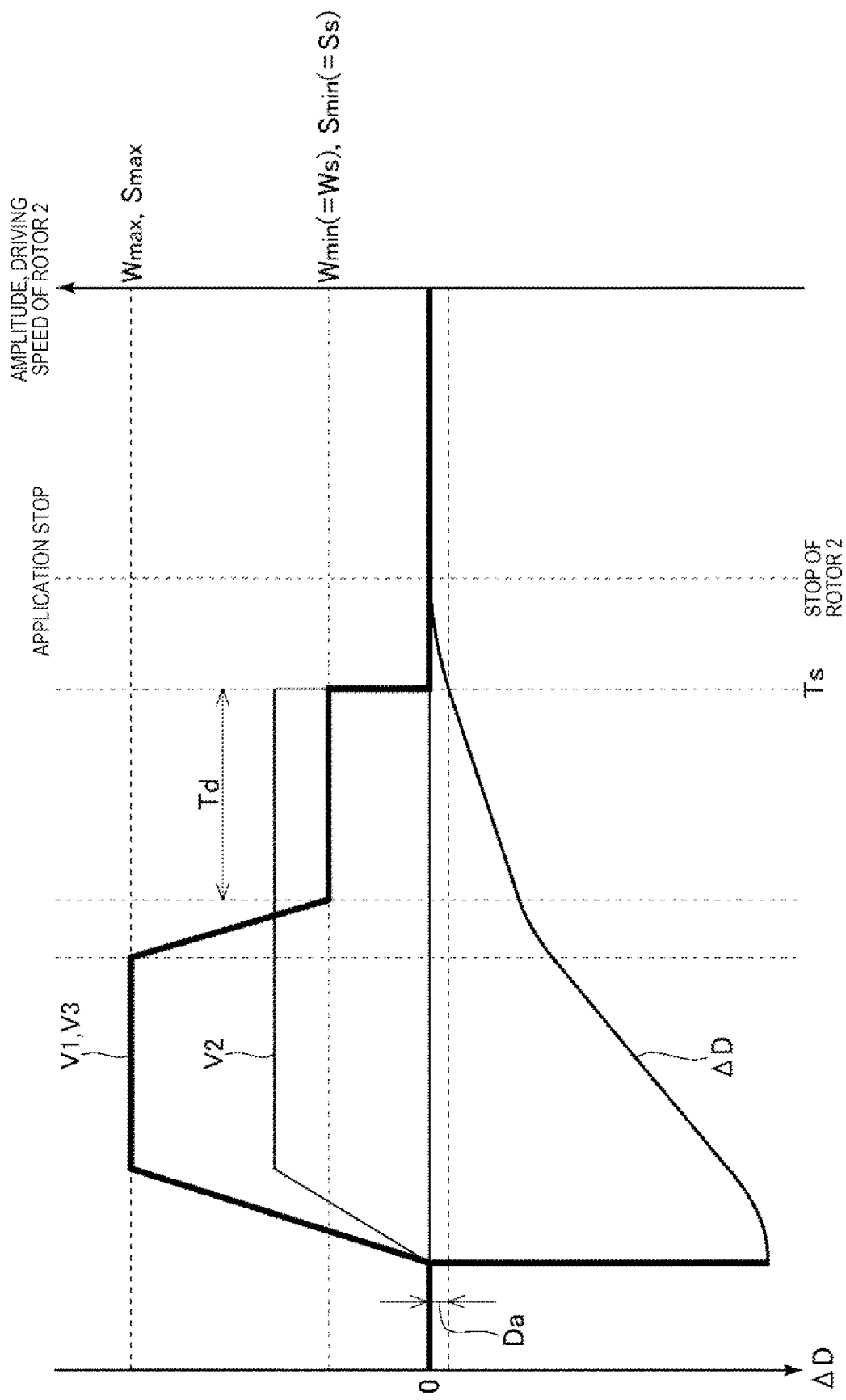
FIG. 6 is a graph for explaining a control method of the control device.

FIG. 1 is a plan view illustrating a piezoelectric driving device according to a preferred embodiment of the present disclosure. FIGS. 2 and 3 are plan views for explaining driving of a piezoelectric actuator. FIG. 4 is a view illustrating a drive signal applied to the piezoelectric actuator. FIG. 5 is a block diagram illustrating a circuit configuration of a control device. FIGS. 6 and 7 are graphs for explaining a control method of the control device.

In FIGS. 1 to 3, for convenience, three axes being perpendicular to one another are respectively referred to as an X axis, a Y axis, and a Z axis, and a direction along the X axis is referred to as an X-axis direction, a direction along the Y axis is referred to as a Y-axis direction, and a direction along the Z axis is referred to as a Z-axis direction. In addition, a side of each of the axes pointed by an arrow is also referred to as a "positive side", and a side of each of the axes opposite to the arrow is also referred to as a "negative side". In addition, the positive side in the X-axis direction is also referred to as "upper" or an "upper side", and the negative side in the X-axis direction is also referred to as "lower" or a "lower side".

An piezoelectric driving device 1 illustrated in FIG. 1 includes a rotor 2 having a disk shape and serving as a driven unit capable of rotating around a center axis O thereof and a driving unit 3 abutting on an outer peripheral surface 21 of the rotor 2 and rotating the rotor 2 around the center axis O. In addition, the driving unit 3 includes a piezoelectric actuator 4, a biasing member 5 biasing the piezoelectric actuator 4 toward the rotor 2, and a control device 7 controlling the driving of the piezoelectric actuator 4. When the piezoelectric actuator 4 is bending-vibrated in the piezoelectric driving device 1, the vibration thereof is transmitted to the rotor 2 and the rotor 2 is rotated around the center axis O.

A configuration of the piezoelectric driving device 1 is not limited to the configuration in FIG. 1. For example, a plurality of driving units 3 may be disposed along a peripheral direction of the rotor 2 and rotate the rotor 2 by the driving of the plurality of driving units 3. In addition, the driving unit 3 may not abut on the outer peripheral surface 21 of the rotor 2, and abut on an upper surface 22, which is a main surface of the rotor 2. In addition, the driven unit is not limited to a rotating body such as the rotor 2, and for example, may be a linearly moving slider.

The piezoelectric driving device 1 includes an encoder 9 disposed at the rotor 2 and can detect a behavior, particularly, rotation and an angular velocity of the rotor 2 by the encoder 9. The encoder 9 is not particularly limited, and for example, may be an incremental encoder detecting rotation of the rotor 2 at the time of rotating the rotor 2 and an absolute encoder detecting an absolute position from an origin of the rotor 2 regardless of whether or not the rotor 2 is rotated.

The encoder 9 includes a scale 91 fixed to the upper surface 22 of the rotor 2 and an optical element 92 facing the scale 91 at a side of the upper surface of the rotor 2. The scale 91 has a disk shape and is provided with a pattern (not illustrated). Meanwhile, the optical element includes a light emitting element 921 emitting light toward the pattern of the scale 91 and a light receiving element 922 receiving the light reflected by the scale 91. The encoder 9 having such a configuration can detect the rotation, the driving speed, the absolute position, and the like of the rotor 2 based on a light receiving result of the light receiving element 922. However, a configuration of the encoder 9 is not limited to the configuration described above. For example, the rotation, the driving speed, the absolute position, and the like of the rotor 2 may be detected by template matching using an imaging element.

As illustrated in FIG. 1, the piezoelectric actuator 4 includes a vibrator 41, a support portion 42 supporting the vibrator 41, a coupling portion 43 coupling the vibrator 41 and the support portion 42 with each other, and a projection portion 44 coupled to the vibrator 41 and transmitting the vibration of the vibrator 41 to the rotor 2.

The vibrator 41 has a plate shape provided with the X-axis direction as a thickness direction and extending in a Y-Z plane including the Y axis and the Z axis and is bent in the Z-axis direction while extended and contracted in the Y-axis direction, thereby bending-vibrating into an S shape as illustrated in FIGS. 2 and 3. In addition, the vibrator 41 has a longitudinal shape with the Y-axis direction which is an extending and contracting direction as a longitudinal direction, in a plan view seen from the X-axis direction. However, the shape of the vibrator 41 is not particularly limited as long as the function thereof can be exhibited.

As illustrated in FIGS. 2 and 3, the vibrator 41 includes driving piezoelectric elements 6A to 6E bending-vibrating the vibrator 41 and detection piezoelectric elements 6F and 6G for detecting the vibration of the vibrator 41.

The respective piezoelectric elements 6A to 6E are extended and contracted in the Y-axis direction as the longitudinal direction of the vibrator 41 by energization. In addition, the piezoelectric elements 6F and 6G receive an external force according to the vibration of the vibrator 41 caused by the driving of the piezoelectric elements 6A to 6E and output a signal according to the received external force. Therefore, a vibration state of the vibrator 41 can be detected based on the signal output from the piezoelectric elements 6F and 6G.

For example, when a drive signal V1 is applied to the piezoelectric elements 6A and 6E, a drive signal V2 is applied to the piezoelectric element 6C, and a drive signal V3 is applied to the piezoelectric elements 6B and 6D as illustrated in FIG. 4, the vibrator 41 is bending-vibrated into an S shape in the Z-axis direction while extending and contracting in the Y-axis direction and these vibrations are thus combined and a tip of the projection portion 44 performs elliptic movement as pointed by arrow A1 as illustrated in FIG. 2. Then, the rotor 2 is fed out by the elliptic movement of the projection portion 44 and the rotor 2 is rotated in a direction of arrow B1. On the other hand, as illustrated in FIG. 3, when wavelengths of the drive signals V1 and V3 are switched from each other, the vibrator 41 is bending-vibrated into an S shape in the Z-axis direction while extending and contracting in the Y-axis direction and these vibrations are thus combined and the projection portion 44 performs elliptic movement as pointed by arrow A2, as illustrated in FIG. 3. Then, the rotor 2 is fed out by the elliptic movement of the projection portion 44 and the rotor 2 is rotated in a direction of arrow B2. As illustrated in FIG. 4, a pickup voltage Vpu is output from the piezoelectric elements 6F and 6G corresponding to the vibration of the vibrator 41.

In the piezoelectric actuator 4 having such a configuration, the projection portion 44 is bending-vibrated in the Z-axis direction due to the extension and contraction of the piezoelectric elements 6A, 6B, 6D, and 6E and the rotor 2 is fed out in the direction of arrow B1 or arrow B2. Therefore, by controlling amplitudes of the drive signals V1 and V3 applied to the piezoelectric elements 6A, 6B, 6D, and 6E and an amplitude of the projection portion 44 to the Z-axis direction, the driving speed, that is, the angular velocity of the rotor 2 can be controlled. That is, the amplitude of the projection portion 44 to the Z-axis direction is increased as the amplitudes of the drive signals V1 and V3 are increased, and the driving speed of the rotor 2 is thus increased.

The control device 7 controls the driving of the piezoelectric actuator 4. The control device 7 is composed of a computer, for example, and includes a processor for processing information (CPU), a memory coupled to the processor in a communicable manner, and an external interface. The memory stores various programs executable by the processor and the processor can read and execute various programs stored in the memory.

As illustrated in FIG. 5, the control device 7 includes a first drive signal generation circuit 71 generating the drive signal V1, a second drive signal generation circuit 72 generating the drive signal V2, and a third drive signal generation circuit 73 generating the drive signal V3.

The first drive signal generation circuit 71 includes a first PWM waveform generation unit 711 generating a pulse signal P1 and a first drive signal generation unit 712 generating the drive signal V1 from the pulse signal P1 generated by the first PWM waveform generation unit 711. Similarly, the second drive signal generation circuit 72 includes a second PWM waveform generation unit 721 generating a pulse signal P2 and a second drive signal generation unit 722 generating the drive signal V2 from the pulse signal P2 generated by the second PWM waveform generation unit 721. Similarly, the third drive signal generation circuit 73 includes a third PWM waveform generation unit 731 generating a pulse signal P3 and a third drive signal generation unit 732 generating the drive signal V3 from the pulse signal P3 generated by the third PWM waveform generation unit 731. Note that, the "PWM" is an abbreviation of "pulse width modulation".

The control device 7 includes a position deviation detection circuit 74 detecting a difference $\Delta D$ between a target position D1 of the rotor 2 which is received from a host computer (not illustrated) and a current position D2 of the rotor 2 which is obtained from the encoder 9. Then, the control device 7 controls duties of the pulse signals P1 and P3 generated by the first and third PWM waveform generation units 711 and 731 based on the difference $\Delta D$. In addition, the control device 7 includes a voltage difference detection circuit 75 detecting a difference $\Delta V$ between a target pickup voltage value Vm received from the host computer (not illustrated) and the pickup voltage Vpu output from the piezoelectric elements 6F and 6G. Then, the control device 7 controls a duty of the pulse signal P2 generated by the second PWM waveform generation unit 721 so that the difference $\Delta V$ is zero.

The duty is a ratio of L to H of the pulse width and can be changed in a range of 0% to 50%. As the duties of the pulse signals P1, P2, and P3 approach 0%, the amplitudes of the drive signals V1, V2, and V3 generated by the first, second, and third drive signal generation units 712, 722, and 732 are reduced. On the contrary, as the duties of the pulse signals P1, P2, and P3 approach 50%, the amplitudes of the drive signals V1, V2, and V3 generated by the first, second, and third drive signal generation units 712, 722, and 732 are increased. Therefore, as the duties of the pulse signals P1 and P3 approach 0%, the driving speed of the rotor 2 becomes slow, and on the contrary, as the duty of the pulse signal P1 approaches 50%, the driving speed of the rotor 2 becomes fast.

When the duties of the pulse signals P1, P2, and P3 approach 0%, depending on the wiring resistance in the circuit, or the like, waveforms of the pulse signals P1, P2, and P3 generated by the first, second, and third PWM waveform generation units 711, 721, and 731 are deformed from an ideal rectangular wave, and due to this, the waveforms of the drive signals V1, V2, and V3 generated by the first, second, and third drive signal generation units 712, 722, and 732 are also deformed from an ideal sine waveform. Therefore, the control of the driving of the piezoelectric actuator 4 is unstable with the drive signals V1, V2, and V3 having a small amplitude.

The control device 7 does not use the small amplitude for the drive signals V1, V2, and V3, and among them, in particular, the drive signals V1 and V3 for controlling the driving speed of the rotor 2. Specifically, as illustrated in FIG. 6, the control device 7 sets the minimum amplitude Wmin so that the waveforms of the drive signals V1 and V3 are not allowed to be deformed in a range less than the minimum amplitude, and when the driving of the rotor 2 is stopped, the control device 7 controls the duties of the pulse signals P1 and P3 so that the amplitudes of the drive signals V1 and V3 are not to be less than the minimum amplitude Wmin. In other words, the control device 7 sets the minimum driving speed Smin of the rotor 2 so that the waveforms of the drive signals V1 and V3 are not allowed to be deformed, and when the driving of the rotor 2 is stopped, the control device 7 controls the duties of the pulse signals P1 and P3 so that the driving speed of the rotor 2 is not to be the minimum driving speed Smin or less. Accordingly, the control of the driving of the piezoelectric actuator 4 is stable. The minimum amplitude Wmin (minimum driving speed Smin) can be appropriately set based on accuracy required for the piezoelectric driving device 1.

Furthermore, the control device 7 sets a stopped-time amplitude Ws as an amplitude of the drive signals V1 and V3 when the driving of the rotor 2 is stopped. Then, when the driving of the rotor 2 is stopped, the control device 7 stops the application of the drive signals V1, V2, and V3 to the piezoelectric actuator 4 in a state in which the amplitudes of the drive signals V1 and V3 are denoted as the stopped-time amplitude Ws. The stopped-time amplitude Ws may be the minimum amplitude Wmin or more, that is, Ws≥Wmin. In other words, the control device 7 sets a stopped-time speed Ss as a driving speed of the rotor 2 when the driving of the rotor 2 is stopped. The stopped-time speed Ss is a reference speed. Then, when the driving of the rotor 2 is stopped, the control device 7 stops the application of the drive signals V1, V2, and V3 to the piezoelectric actuator 4 in a state in which the driving speed of the rotor 2 is denoted as the stopped-time speed Ss. The stopped-time speed Ss may be the minimum driving speed Smin or more, that is, Ss≥Smin. In the present embodiment, Ws=Wmin and Ss=Smin.

As illustrated in FIG. 6, even when the application of the drive signals V1, V2, and V3 to the piezoelectric actuator 4 is stopped, the rotor 2 continues to move for a while even after the application is stopped, without stopping immediately due to a residual vibration or inertia of the vibrator 41. Then, the control device 7 sets an excessive movement amount of the rotor 2 since the application of the drive signals V1, V2, and V3 to the piezoelectric actuator 4 is stopped until the rotor 2 is actually stopped in a state in which the amplitudes of the drive signals V1 and V3 are denoted as the stopped-time amplitude Ws, as a reference movement amount Da. Then, the control device 7 stops the application of the drive signals V1, V2, and V3 to the piezoelectric actuator 4 when the difference ΔD detected by the position deviation detection circuit 74, that is, the difference between the target position D1 and the current position D2 is denoted as the reference movement amount Da. By doing this, the rotor 2 can be stopped at the target position D1 by the excessive movement after the stopping of the application.

Note that, the expression "when the difference ΔD is denoted as a reference movement amount Da" means as follows, for example. For example, the position deviation detection circuit 74 repeatedly detects the difference ΔD at a frequency interval of a reference clock pulse CP output from an oscillator (not illustrated). Therefore, a time when it is first detected that the difference ΔD is denoted as the reference movement amount Da or less in the position deviation detection circuit 74 means "when the difference ΔD is a reference movement amount Da".

The reference movement amount Da may fluctuate due to wear on each unit of the piezoelectric driving device 1, in particular, wear on the outer peripheral surface 21 of the rotor 2 or the projection portion 44. Thus, the control device 7 may detect the actual excessive movement amount of the rotor 2 from the output of the encoder 9, set the corresponding value as a new reference movement amount Da, and correct the reference movement amount Da based on the corresponding value. Accordingly, the control device 7 can correct and update the reference movement amount Da according to the state in which the piezoelectric driving device 1 varies with time. Therefore, high accuracy of the stop position of the rotor 2 can be kept for a long period of time.

In addition, the control device 7 keeps a state in which the amplitudes of the drive signals V1 and V3 when the driving of the rotor 2 is stopped are set as the stopped-time amplitude Ws for a predetermined time or longer. Thus, the control device 7 sets a keeping time Td as the predetermined time. Then, when the driving of the rotor 2 is stopped, the control device 7 stops the application of the drive signals V1, V2, and V3 to the piezoelectric actuator 4 after the amplitudes of the drive signals V1 and V3 are set as the stopped-time amplitude Ws and then the state thereof is kept for the keeping time Td or longer. In other words, the control device 7 keeps a state in which the driving speed of the rotor 2 when the driving of the rotor 2 is stopped is set as the stopped-time speed Ss for a predetermined time or longer. Thus, the control device 7 sets the keeping time Td as the predetermined time. Then, when the driving of the rotor 2 is stopped, the control device 7 stops the application of the drive signals V1, V2, and V3 to the piezoelectric actuator 4 after the driving speed of the rotor 2 is set as the stopped-time speed Ss and then the state thereof is kept for the keeping time Td or longer. Accordingly, since the driving of the rotor 2 can be stopped in a state in which the driving is stable, the excessive movement amount of the rotor 2 is difficult to be deviated from the reference movement amount Da. Therefore, the stop position of the rotor 2 can be more accurately controlled.

The keeping time Td is not particularly limited and is different depending on the accuracy required for the piezoelectric driving device 1, but can be, for example, about 1/1000 seconds to 1/100 seconds. Accordingly, since it is a sufficiently short time and a sufficient time to stabilize the driving of the rotor 2, the accuracy of the stop position of the rotor 2 can be sufficiently enhanced while sufficiently keeping back the total time for the movement of the rotor 2 from being long.

That is, the control device 7 obtains a time Ts at which the difference $\Delta D$ is denoted as the reference movement amount Da based on a moving speed or the like of the rotor 2 obtained from the difference $\Delta D$, and sets the amplitudes of the drive signals V1 and V3 in the keeping time Td or longer earlier than the obtained time Ts as the stopped-time amplitude Ws (the driving speed of the rotor 2 is set as the stopped-time speed Ss).

As illustrated in FIG. 6, the control device 7 applies the drive signals V1 and V3 having an amplitude larger than the stopped-time amplitude Ws to the piezoelectric actuator 4 before the stopped-time amplitude Ws is kept for the keeping time Td or longer. In other words, the rotor 2 is driven at a speed faster than the stopped-time speed Ss and then is decelerated to the stopped-time speed Ss. Accordingly, the rotor 2 can be moved to the target position D1 in a further short time.

As described above, the position deviation detection circuit 74 continuously detects the difference $\Delta D$ at the frequency interval of the reference clock pulse CP. Therefore, as illustrated in FIG. 7, an error G may occur in the stop position of the rotor 2 according to a timing of the reference clock pulse CP. That is, it is detected that "the difference $\Delta D$ is denoted as the reference movement amount Da" at the timing of the n-th reference clock pulse CP as indicated by lines L1 and L2 illustrated in FIG. 7, but the line L1 indicates that the difference $\Delta D$ at the time of detecting is equal to the reference movement amount Da, and thus the stop position of the rotor 2 is denoted as the target position D1. Meanwhile, the line L2 indicates that the difference $\Delta D$ at the time of detecting is smaller than the reference movement amount Da, and thus only the error G in the stop position of the rotor 2 is out of the target position D1.

The control device 7 controls the previous driving speed of the rotor 2 so that the position deviation detection circuit 74 detects the difference $\Delta D$ at the timing when the difference $\Delta D$=the reference movement amount Da. Accordingly, the error G is substantially eliminated, and thus the accuracy of the stop position of the rotor 2 is further improved. Such a method is not particularly limited, and for example, by adjusting a deceleration when the rotor 2 is decelerated from the maximum speed Smax to the stopped-time speed Ss, that is, a deceleration when the drive signals V1 and V3 are decelerated from the maximum amplitude Wmax to the stopped-time amplitudes Ws as an example illustrated in FIG. 6, the position deviation detection circuit 74 may detect the difference $\Delta D$ at the timing when the difference $\Delta D$=the reference movement amount Da. In addition, the position deviation detection circuit 74 may detect the difference $\Delta D$ at the timing when the difference $\Delta D$=the reference movement amount Da by slightly adjusting the driving speed of the rotor 2 during the keeping time Td.

Hitherto, the piezoelectric driving device 1 and the control method thereof have been described. A control method of the piezoelectric driving device 1 which includes the vibrator 41 including the piezoelectric elements 6A to 6E and vibrating by application of the drive signals V1, V2, and V3 to the piezoelectric elements 6A to 6E, the rotor 2 moving by the vibration of the vibrator 41 as a driven unit, and the first, second, and third drive signal generation circuits 71, 72, and 73 generating the drive signals V1, V2, and V3 based on the pulse signals P1, P2, and P3 as a drive signal generation unit, the control method of the piezoelectric driving device 1 includes stopping the application of the drive signals V1, V2, and V3 to the piezoelectric elements 6A to 6E at the time when a driving speed of the rotor 2 is the stopped-time speed Ss as a reference speed, when driving of the rotor 2 is stopped.

As described above, if the application of the drive signals V1, V2, and V3 to the piezoelectric elements 6A to 6E is stopped when the driving speed of the rotor is a predetermined stopped-time speed Ss, an excessive movement amount of the rotor 2 from a time of stop to a time when the rotor 2 is actually stopped can be grasped in advance. Therefore, if the application of the drive signals V1, V2, and V3 to the piezoelectric elements 6A to 6E is stopped in consideration of the excessive movement amount, the rotor 2 can be stopped at a target position. In particular, the stopped-time speed Ss is set sufficiently high, such that the accuracy of the stop position of the rotor 2 is further improved without necessarily using the drive signals V1, V2, and V3 having deformed waveforms.

As described above, in the control method of the piezoelectric driving device 1, when the difference between the target position D1 and the current position D2 of the rotor 2 is denoted as the difference $\Delta D$, the application of the drive signals V1, V2, and V3 to the piezoelectric elements 6A to 6E is stopped based on the difference $\Delta D$. That is, a timing when the application of the drive signals V1, V2, and V3 to the piezoelectric elements 6A to 6E is stopped is controlled in consideration of the excessive movement amount of the rotor 2. Accordingly, the rotor 2 can be stopped at the target position.

As described above, in the control method of the piezoelectric driving device 1, when a distance in which the rotor 2 is moved since the application of the drive signals V1, V2, and V3 to the piezoelectric elements 6A to 6E is stopped until the rotor 2 is stopped, is denoted as the reference movement amount Da, the application of the drive signals V1, V2, and V3 to the piezoelectric elements 6A to 6E is stopped in a stage of initially detecting $\Delta D \leq Da$. Accordingly, the error between $\Delta D$ and Da is decreased, and thus the accuracy of the stop position of the rotor 2 is further improved.

As described above, in the control method of the piezoelectric driving device 1, when the difference $\Delta D$=the reference movement amount Da, a detection timing of the difference $\Delta D$ is controlled so as to detect the reference movement amount Da. Accordingly, the error between $\Delta D$ and Da is substantially eliminated, and thus the accuracy of the stop position of the rotor 2 is further improved.

As described above, in the control method of the piezoelectric driving device 1, the detection timing of the difference $\Delta D$ is controlled by changing the stopped-time speed Ss. Accordingly, the detection timing of the difference $\Delta D$ can be controlled in a relatively simple method.

As described above, in the control method of the piezoelectric driving device 1, the application of the drive signals V1, V2, and V3 to the piezoelectric elements 6A to 6E is stopped after the driving speed of the rotor 2 is kept for the keeping time Td, which is a reference time, at the stopped-time speed Ss. Accordingly, as a state of the rotor 2 immediately before stopping the application is stabilized, the accuracy of the stop position of the rotor 2 is improved.

As described above, in the control method of the piezoelectric driving device 1, the rotor 2 is driven at a speed faster than the stopped-time speed Ss and then is decelerated to the stopped-time speed Ss. Accordingly, the rotor 2 can be moved to the target position in a further short time.

As described above, the piezoelectric driving device 1 includes the vibrator 41 including the piezoelectric elements 6A to 6E and vibrating by application of the drive signals V1, V2, and V3 to the piezoelectric elements 6A to 6E, the rotor 2 moving by the vibration of the vibrator 41 as a driven unit, the first, second, and third drive signal generation circuits 71, 72, and 73 generating the drive signals V1, V2, and V3 based on the pulse signals P1, P2, and P3 as a drive signal generation unit, and the control device 7 stopping the application of the drive signals V1, V2, and V3 to the piezoelectric elements 6A to 6E at the time when a driving speed of the rotor 2 is the stopped-time speed Ss as a reference speed, in a case of stopping driving of the rotor 2.

As described above, if the application of the drive signals V1, V2, and V3 to the piezoelectric elements 6A to 6E is stopped when the driving speed of the rotor is a predetermined stopped-time speed Ss, an excessive movement amount of the rotor 2 from a time of stop to a time when the rotor 2 is actually stopped can be grasped in advance. Therefore, if the application of the drive signals V1, V2, and V3 to the piezoelectric elements 6A to 6E is stopped in consideration of the excessive movement amount, the rotor 2 can be stopped at a target position. In particular, the stopped-time speed Ss is set sufficiently high, such that the accuracy of the stop position of the rotor 2 is further improved without necessarily using the drive signals V1, V2, and V3 having deformed waveforms.

Hitherto, while the control method of the piezoelectric driving device and the piezoelectric driving device according to the present disclosure have been described based on the illustrated embodiment, the present disclosure is not limited thereto, and the configuration of each part may be replaced with any other configuration having the same function. In addition, the present disclosure may also be configured with any other constituents. In addition, each embodiment described above may be appropriately combined.

What is claimed is:

1. A control method of a piezoelectric driving device which includes a vibrator including a piezoelectric element and vibrating by application of a drive signal to the piezoelectric element, a driven unit moving by the vibration of the vibrator, a drive signal generation unit generating the drive signal based on a pulse signal, the control method comprising:
    stopping the application of the drive signal to the piezoelectric element at a time when a driving speed of the driven unit is a reference speed, in a case of stopping driving of the driven unit, wherein the driven unit continues to move to a target position after the stopping of the application.

2. The control method of the piezoelectric driving device according to claim 1, wherein
    $\Delta D$ is a difference between the target position and a current position of the driven unit, and the application of the drive signal to the piezoelectric element is stopped based on the difference $\Delta D$.

3. The control method of the piezoelectric driving device according to claim 2, wherein
    $D_a$ is a distance as a reference movement amount, by which the driven unit is moved after the application of the drive signal to the piezoelectric element is stopped until the driven unit is stopped, and the application of the drive signal to the piezoelectric element is stopped in a stage of initially detecting $\Delta D \leq D_a$.

4. The control method of the piezoelectric driving device according to claim 2, wherein
    a detection timing of the difference $\Delta D$ is controlled by changing the reference speed.

5. The control method of the piezoelectric driving device according to claim 1, wherein
    the application of the drive signal to the piezoelectric element is stopped after the driving speed of the driven unit is kept for a reference time at the reference speed.

6. The control method of the piezoelectric driving device according to claim 1, wherein
    the driven unit is driven at a speed faster than the reference speed and then is decelerated to the reference speed.

7. A piezoelectric driving device comprising:
    a vibrator including a piezoelectric element and vibrating by application of a drive signal to the piezoelectric element;
    a driven unit moving by the vibration of the vibrator;
    a drive signal generation unit generating the drive signal based on a pulse signal; and
    a control device stopping the application of the drive signal& to the piezoelectric element at a time when a driving speed of the driven unit is a reference speed, in a case of stopping driving of the driven unit, wherein the driven unit continues to move to a target position after the stopping of the application.

8. The piezoelectric driving device according to claim 7, wherein
    $\Delta D$ is a difference between the target position and a current position of the driven unit, and the application of the drive signal to the piezoelectric element is stopped based on the difference $\Delta D$.

9. The piezoelectric driving device according to claim 8, wherein
    $D_a$ is a distance as a reference movement amount, by which the driven unit is moved after the application of the drive signal to the piezoelectric element is stopped until the driven unit is stopped, and the application of the drive signal to the piezoelectric element is stopped in a stage of initially detecting $\Delta D \leq D_a$.

10. The piezoelectric driving device according to claim 8, wherein
    a detection timing of the difference $\Delta D$ is controlled by changing the reference speed.

11. The piezoelectric driving device according to claim 7, wherein
    the application of the drive signal to the piezoelectric element is stopped after the driving speed of the driven unit is kept for a reference time at the reference speed.

12. The piezoelectric driving device according to claim 7, wherein
    the driven unit is driven at a speed faster than the reference speed and then is decelerated to the reference speed.

* * * * *